United States Patent
Mitsuiki et al.

(10) Patent No.: US 7,510,981 B2
(45) Date of Patent: Mar. 31, 2009

(54) METHOD FOR MANUFACTURING SEMICONDUCTOR DEVICE

(75) Inventors: Akira Mitsuiki, Kanagawa (JP); Tomoo Nakayama, Kanagawa (JP); Osamu Fujita, Kanagawa (JP)

(73) Assignee: NEC Electronics Corporations, Kanagawa (JP)

( * ) Notice: Subject to any disclaimer, the term of this patent is extended or adjusted under 35 U.S.C. 154(b) by 195 days.

(21) Appl. No.: 11/542,219

(22) Filed: Oct. 4, 2006

(65) Prior Publication Data

US 2007/0087520 A1    Apr. 19, 2007

(30) Foreign Application Priority Data

Oct. 17, 2005   (JP)   ............... 2005-302056

(51) Int. Cl.
  *H01L 21/302*   (2006.01)
(52) U.S. Cl. .............. 438/738; 438/706; 438/424; 257/E21.545
(58) Field of Classification Search .............. 438/400, 438/424, 706, 738; 257/E21.545
See application file for complete search history.

(56) References Cited

U.S. PATENT DOCUMENTS

| | | | |
|---|---|---|---|
| 6,509,271 B1 * | 1/2003 | Kobayashi | ............. 438/692 |
| 6,653,202 B1 | 11/2003 | Fisher et al. | |
| 2005/0227450 A1 | 10/2005 | Derderian et al. | |
| 2006/0205207 A1 * | 9/2006 | Chen et al. | ............. 438/638 |
| 2007/0287260 A1 * | 12/2007 | Wu et al. | ............. 438/400 |

FOREIGN PATENT DOCUMENTS

JP   2004-172417   6/2004

* cited by examiner

*Primary Examiner*—Bradley K Smith
(74) *Attorney, Agent, or Firm*—Young & Thompson (57) ABSTRACT

A semiconductor device includes an element isolation film, which exhibits less variations in the height dimension from the surface of the substrate and has a desired height dimension from the surface of the substrate. A process for manufacturing a semiconductor device includes: providing a predetermined pattern of a silicon nitride film and a protective film which covers the silicon nitride film, on a semiconductor substrate; selectively etching the semiconductor substrate using the protective film as a mask to form a trenched portion; removing the protective film to expose the silicon nitride film; depositing an element isolation film, so as to fill the trenched portion therewith and cover the silicon nitride film; removing the element isolation film formed on the silicon nitride film by polishing thereof until the silicon nitride film is exposed; and removing the silicon nitride film.

14 Claims, 5 Drawing Sheets

METHOD FOR MANUFACTURING SEMICONDUCTOR DEVICE

This application is based on Japanese patent application No. 2005-302,056, the content of which is incorporated hereinto by reference.

BACKGROUND

1. Field of the Invention

The present invention relates to a method for manufacturing a semiconductor device, and particularly relates to a technology for forming an element isolation film.

2. Related Art

Figure 4A:
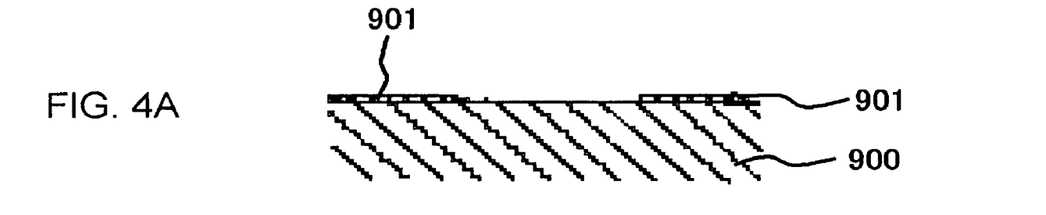
FIGS. 4A to 4F are cross-sectional view of a semiconductor device, illustrating a conventional process for manufacturing a semiconductor device.
Figure 4B:
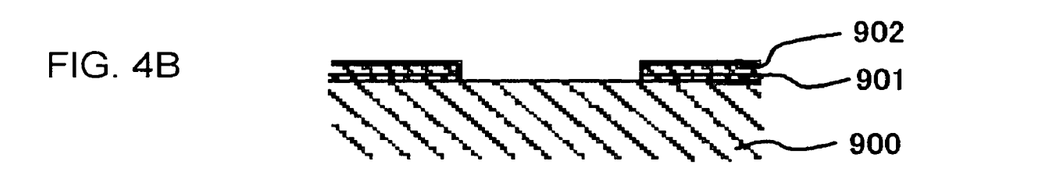
Figure 4C:
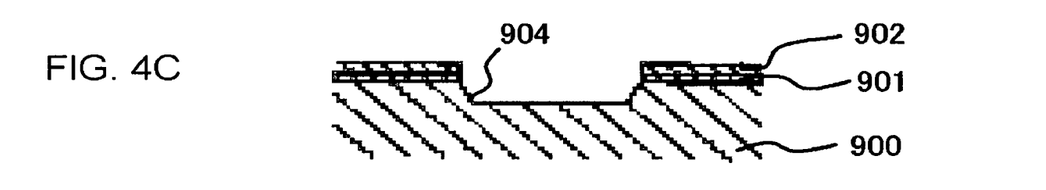
Figure 4D:
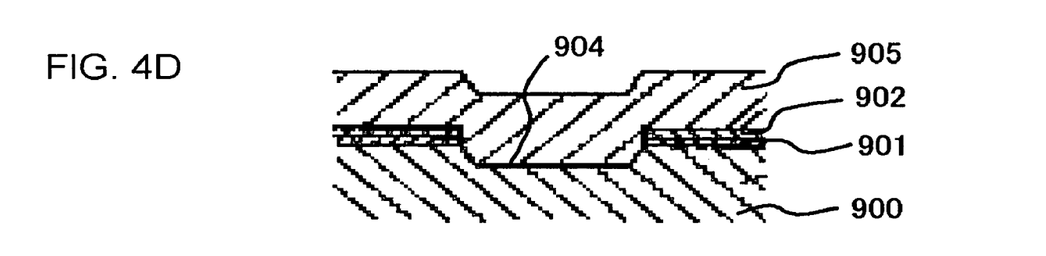
Figure 4E:
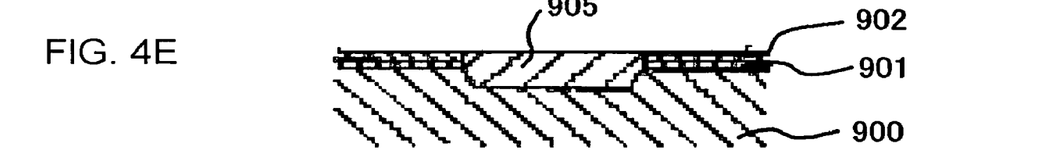
Figure 4F:
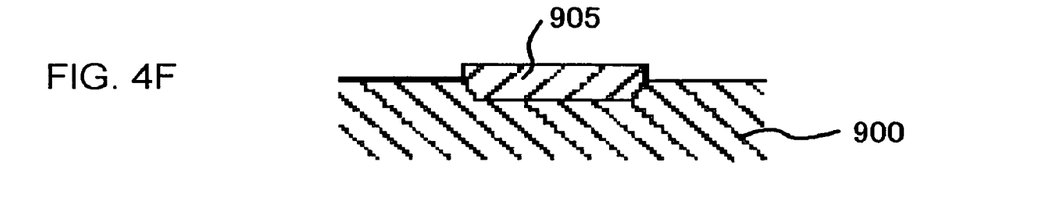

Conventionally, a region for forming a transistor and an element isolation region are created on a semiconductor substrate. The element isolation region is formed as described below, for example. As shown in FIG. 4A, a thin film 901 is provided so as to cover a region for forming the transistor on a semiconductor substrate 900, and further, as shown in FIG. 4B, a silicon nitride film 902 is provided on the thin film 901. The thin film 901 is one that is harder than a silicon nitride film 902. Thereafter, as shown in FIG. 4C, the semiconductor substrate 900 is etched through a mask of the silicon nitride film 902 to form a trenched portion 904. As shown in FIG. 4D, the trenched portion 904 is filled, and an element isolation film 905 that covers the silicon nitride film 902 is formed. Thereafter, as shown in FIG. 4E, the element isolation film 905 is polished via a chemical mechanical polishing (CMP) until the silicon nitride film 902 is exposed to remove the silicon nitride film 902 and the thin film 901 via a wet etch process, as shown in FIG. 4F (see, for example, Japanese Patent Laid-Open No. 2004-172,417). Since the silicon nitride film 902 functions as a stop film for the chemical mechanical polishing process during the polishing of the element isolation film 905, a height dimension of the element isolation film 905 from the surface of the substrate is substantially equivalent to a height dimension of a combination of the thickness of the silicon nitride film 902 and the thickness of the thin film 901, or shorter than a height dimension of a combination of the thickness of the silicon nitride film 902 and the thickness of thin film 901.

However, there is a room for improvement in view of the following points in the technology described in Japanese Patent Laid-Open No. 2004-172,417. The devices in recent years include an element isolation film for separating a transistor from another transistor, and a width dimension of the element isolation film is decreasing. Corresponding to such trend of providing a reduced width of the element isolation film, a trenched portion, which have conventionally had a tapered cross-section, is required to have a substantially rectangular cross section, in which a width of a bottom surface or a lower side is substantially equivalent to a width of an aperture or an upper side. In order to form such trenched portion having the above-described geometry, it is required that a substrate is vertically etched, and that precipitates created in the process for forming the trenched portion via the etch process is reduced. The precipitates created in the etch process cover the silicon nitride film, so as to function as a mask for adjusting an amount of an etched silicon nitride film created in the etch process for forming the trenched portion. Therefore, a decrease in the amount of the precipitates causes an increase in an amount of the etched silicon nitride film.

Figure 5:
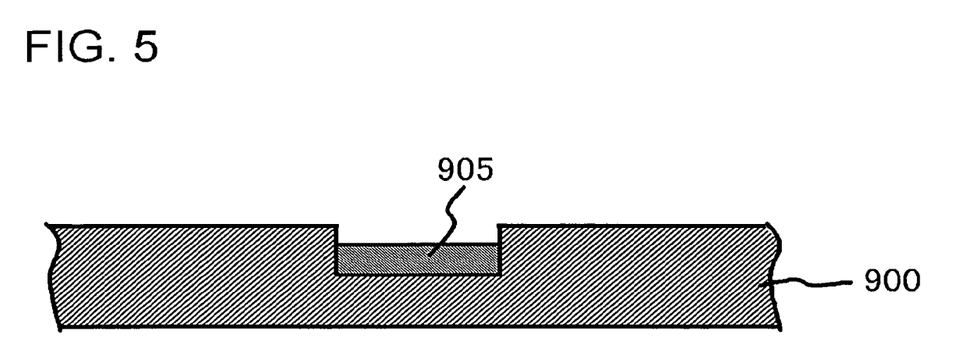
FIG. 5 is a cross-sectional view of a semiconductor device, illustrating a typical element isolation film of a conventional semiconductor device.

Since the element isolation film is more easily polished than the silicon nitride film, when the silicon nitride film that is thinner in thickness is employed as a stop film for a CMP process, a level of the element isolation film 905 may possibly be lower than a level of a surface of the substrate 900, as shown in FIG. 5. Further, in order to adjust the height dimension of the element isolation film from the surface of the substrate to a certain dimension, an adjustment process for the height of the element isolation film may be conducted after the silicon nitride film is removed. When the silicon nitride film that is thinner in thickness is employed as a stop film for a CMP process, the height dimension of the element isolation film from the surface of the substrate is reduced, so that an adjustment of the height dimension of the element isolation film from the surface of the substrate would be difficult.

Further, an increase in the amount of the etched silicon nitride film leads to an uneven etching of the silicon nitride film, so that it is difficult to obtain an element isolation film having an even and uniform height dimension. When a well is formed in the silicon substrate, an impurity is generally implanted into a lower portion of the element isolation film in the silicon substrate. But in such case, a variation in the height dimension of the element isolation film causes a difficulty in providing a well which has a desired depth.

SUMMARY OF THE INVENTION

According to one aspect of the present invention, there is provided a method for manufacturing a semiconductor device, comprising: providing a predetermined pattern of a silicon nitride film and a protective film which covers the silicon nitride film on a semiconductor substrate; selectively etching the semiconductor substrate using the protective film as a mask to form a trenched portion; removing the protective film to expose the silicon nitride film; depositing an element isolation film, so as to fill the trenched portion therewith and cover the silicon nitride film; removing the element isolation film formed on the silicon nitride film by polishing thereof until the silicon nitride film is exposed; and removing the silicon nitride film.

In the conventional technology described above, the silicon nitride film is utilized as a mask for forming the trenched portion and also utilized as a stop film for the use in the polishing process for the element isolation film. On the contrary, according to the above-described aspect of the present invention, the protective film over the nitride film is utilized as a mask for forming the trenched portion and the silicon nitride film is utilized as a stop film for the use in the polishing process for the element isolation film.

Since the protective film covering the silicon nitride film is utilized as a mask during the etch process for forming the trenched portion in the present invention, the silicon nitride film is protected by the protective film during the etch process for forming the trenched portion. Therefore, the silicon nitride film is less to be affected by the etch process for forming the trenched portion. Therefore, in the present invention, a silicon nitride film having a desired thickness can be assured, even if the etch process for forming the trenched portion is conducted. Then the protective film is removed, and thereafter, the element isolation film is deposited, and then the element isolation film formed on the silicon nitride film is removed via the polishing process, so that the silicon nitride film, which has been least to be affected by the etch process for forming the trenched portion and has a predetermined thickness, can be employed as a stop film utilized in the polishing process. Therefore, according to the present invention, an element isolation film having a desired height dimension can be formed. Further, since the silicon nitride film is less to be affected by the etch process for forming the trenched portion in the present invention, a variation in the thickness of the silicon nitride film is less to be caused.

Therefore, a variation in the height dimension of the element isolation film from the surface of the substrate can be inhibited.

According to the present invention, a semiconductor device comprising an element isolation film, which exhibits less variations in the height dimension from the surface of the substrate and has a desired height dimension from the surface of the substrate, is provided.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows, in reference to the annexed figures. An outline of a process for manufacturing a semiconductor device according to the present embodiment will be described. A process for manufacturing a semiconductor device 1 of the present embodiment includes: providing a predetermined pattern of a silicon nitride film 13 and a protective film 14 which covers the silicon nitride film 13 on a semiconductor substrate 11; selectively etching the semiconductor substrate 11 using the protective film 14 as a mask to form a trenched portion 111; removing the protective film 14 to expose the silicon nitride film 13; depositing an element isolation film 16, so as to fill the trenched portion 111 therewith and cover the silicon nitride film 13; removing the element isolation film 16 formed on the silicon nitride film 13 by polishing thereof until the silicon nitride film 13 is exposed; and removing the silicon nitride film 13.

Figure 1A:
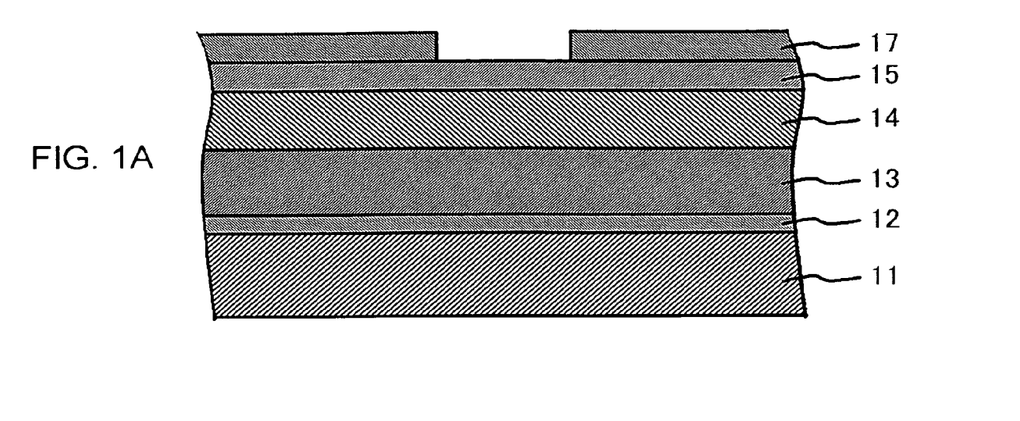
FIGS. 1A to 1C are cross-sectional view of a semiconductor device, illustrating a process for manufacturing the semiconductor device according to an embodiment of the present invention.

The process for manufacturing the semiconductor device of the present embodiment will be described in detail as follows. First of all, as shown in FIG. 1A, the silicon substrate 11, serving as a semiconductor substrate, is thermally oxidized to form a silicon oxide film 12 on the silicon substrate 11. The thickness of the silicon oxide film 12 is, for example, 5 to 15 nm. Next, the silicon nitride film 13 is formed on the silicon oxide film 12 so as to cover the silicon oxide film 12. The silicon nitride film 13 may be deposited via, for example, a CVD process, and the thickness of the silicon nitride film 13 is, for example, 50 to 150 nm. Further, a carbon film formed via a CVD process such as, for example, an amorphous carbon film 14, is deposited as a protective film on the silicon nitride film 13. The thickness of the amorphous carbon film 14 is, for example, 50 to 150 nm. The amorphous carbon film 14 is directly formed on the silicon nitride film 13.

Further, an inorganic film 15 containing Si and O as constituent elements is for directly on the amorphous carbon film 14. For example, SiOC film, SiON film, $SiO_2$ film or the like may be exemplified for the inorganic film 15. The inorganic film 15 is also formed via a CVD process. The thickness of the inorganic film 15 is, for example, 10 to 50 nm. Such inorganic film 15 and the amorphous carbon film 14 form an antireflection film.

A resist is applied on the inorganic film 15, and then, a mask 17 having a predetermined pattern is formed. The mask 17 is formed to have a pattern that covers a device-forming region of the silicon substrate 11. Next, the inorganic film 15 is selectively removed to form the predetermined pattern. For example, a gaseous compound, such as sulfur hexafluoride ($SF_6$), difluoromethane ($CH_2F_2$) and the like is employed to conduct a dry etch process.

Figure 1B:
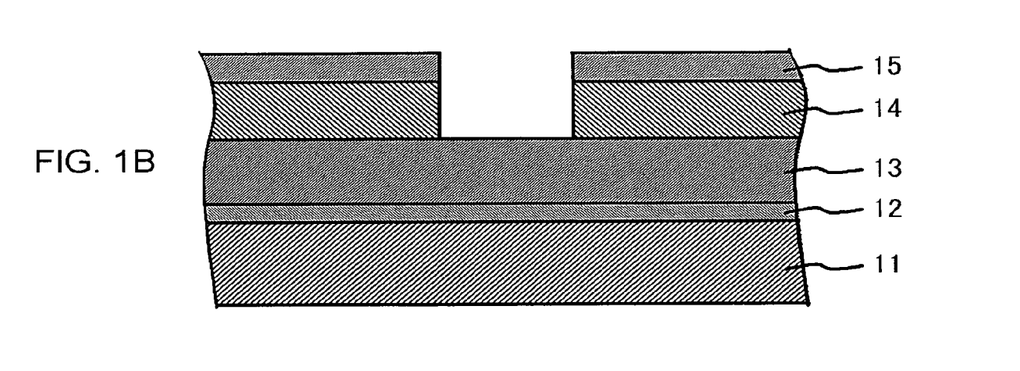

Next, a portion of the amorphous carbon film 14 is selectively removed. For example, a gas containing oxygen (O) such as oxygen ($O_2$) gas is employed as an etchant gas, and a plasma is created, and a dry etch process is conducted with oxygen radical. In addition to the above, a gaseous mixture containing $O_2$ gas and any one of hydrogen bromide (HBr) gas, chlorine ($Cl_2$) gas, argon (Ar) gas, helium (He) gas may be employed to conduct the dry etch process. Here, most portions of the mask 17 are removed by such dry etch process. However, the inorganic film 15 cannot be easily etched, since it exhibits better resistance to oxygen radical, and thus it is remained. More specifically, the inorganic film 15 functions as a mask for the etch process for the amorphous carbon film 14. This configuration provides the amorphous carbon film 14 having a predetermined pattern, as shown in FIG. 1B. In the operation for selectively removing a portion of the amorphous carbon film 14, it is preferable to conduct the etch process for the amorphous carbon film 14 under a condition of a selectivity (etch rate for amorphous carbon film 14/etch rate for inorganic film 15) of equal to or higher than 10, or particularly preferably equal to or higher than 20.

Next, an etch process for the silicon nitride film 13 and the silicon oxide film 12 is conducted. The etch process for the silicon nitride film 13 and the silicon oxide film 12 employs a gaseous compound containing fluorine such as, for example, tetrafluoromethane ($CF_4$), trifluoromethane ($CHF_3$), hexafluoroethane ($C_2F_6$) and the like as an etchant gas, thereby implementing the etch process for the silicon nitride film 13 and the silicon oxide film 12. In addition to the above, a gaseous mixture of the fluorine-containing gas and oxygen gas may alternatively be employed as the etchant gas. Here, the inorganic film 15 is less resistant to the gas for etching the silicon nitride film 13 and the silicon oxide film 12, as described above, and thus the inorganic film 15 is easily removed during the etch process for the silicon nitride film 13 and the silicon oxide film 12.

Figure 1C:
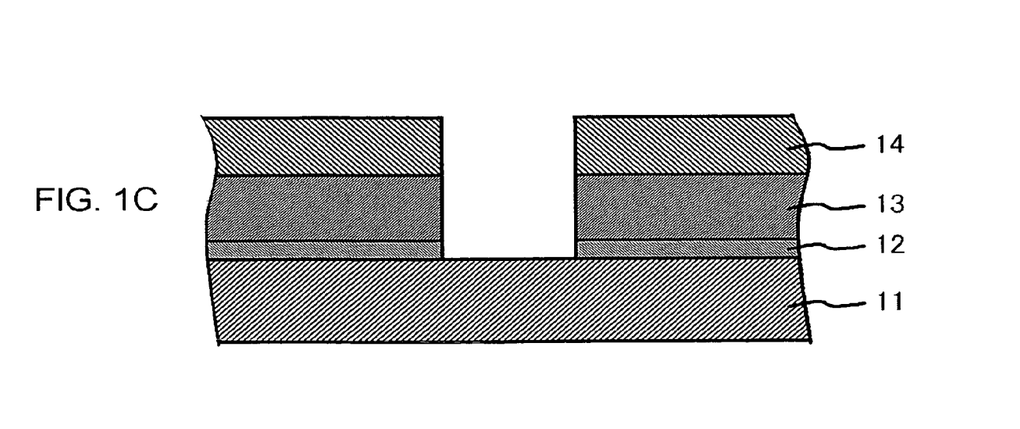

On the other hand, the amorphous carbon film 14 is not removed during the etch process for the silicon nitride film 13 and the silicon oxide film 12, since it is highly resistant to the etchant gas for etching the silicon nitride film 13 and the silicon oxide film 12 as described above. Therefore, the amorphous carbon film 14 functions as a mask for dry-etching the silicon nitride film 13 and the silicon oxide film 12. In this way, the silicon nitride film 13 and the silicon oxide film 12 are dry-etched to form the silicon nitride film 13 and the silicon oxide film 12 having the predetermined pattern, as shown in FIG. 1C. In the operation for etching the silicon nitride film 13, it is preferable to conduct the etch process under a condition of a selectivity: (etch rate for silicon nitride film 13/etch rate for amorphous carbon film 14); of equal to or higher than 3.

Here, the silicon nitride film 13 and the amorphous carbon film 14 having the predetermined pattern form films according to the present invention.

Figure 2A:
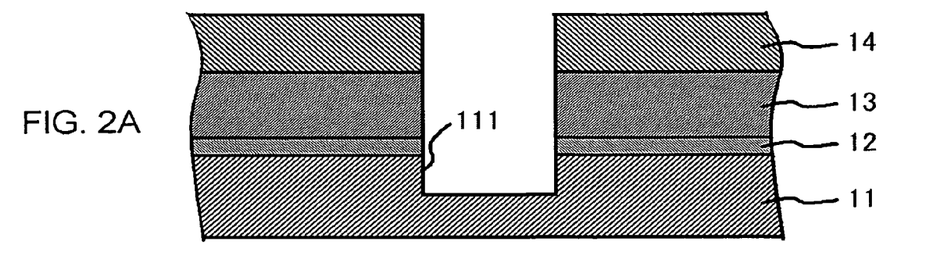
FIGS. 2A to 2C are cross-sectional view of the semiconductor device, illustrating the process for manufacturing the semiconductor device according to the embodiment of the present invention.

Next, as shown in FIG. 2A, the silicon substrate 11 is etched to form a trenched portion 111. The depth dimension of the trenched portion 111 for example, 200 to 400 nm, and a cross-sectional geometry of the trenched portion 111 is a substantially rectangular geometry. A gaseous mixture of a halogen-containing gas (bromine ($Br_2$), chlorine ($Cl_2$), sulfur hexafluoride ($SF_6$)) and any one of oxygen ($O_2$) gas, nitrogen ($N_2$) gas and helium (He) gas, for example, may be employed for the etchant gas to conduct a dry etch of the silicon substrate 11, thereby forming the trenched portion 111. In this case, the amorphous carbon film 14 is not removed in the etch process for the silicon substrate 11, since it is highly resistant to the etchant gas employed for the dry etch process for the silicon substrate 11. Therefore, the amorphous carbon film 14 functions as a mask when it is employed in the process for forming the trenched portion 111 in the silicon substrate 11.

In such operation, it is preferable to conduct the etch process under a condition of a selectivity (etch rate for silicon substrate 11/etch rate for amorphous carbon film 14) of equal to or higher than 5.

Figure 2B:
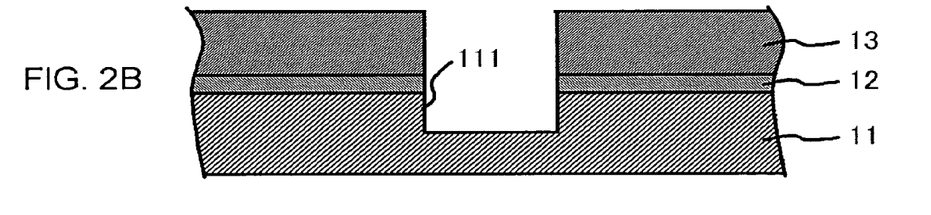

Then, as shown in FIG. 2B, the amorphous carbon film 14 on the silicon substrate 11 is removed. For example, a gas containing O such as $O_2$ gas, is employed as an etchant gas (ashing gas), and a plasma is created, and a dry etch process (oxygen plasma ashing) is conducted with oxygen radical, thereby removing the amorphous carbon film 14. After such procedure, the silicon nitride film 13 is exposed. The silicon nitride film 13 is hardly etched during the removal of the amorphous carbon film 14, since it is highly resistant to $O_2$ gas employed for removing the amorphous carbon film 14. In the operation for removing the amorphous carbon film 14, it is preferable to conduct the etch process under a condition of a selectivity (etch rate for amorphous carbon film 14/etch rate for silicon nitride film 13) of equal to or higher than 20, and more preferably equal to or higher than 100. It is preferable to conduct the etch process under a condition in which substantially no silicon nitride film 13 is etched. Further, it is preferable that an etch rate for the amorphous carbon film 14 is equal to or higher than 100 nm/min. In addition to the above, while $O_2$ gas is employed for the etchant gas in the present embodiment, the available etchant gas is not limited thereto, and nitrogen ($N_2$) gas, hydrogen ($H_2$) gas or the like may be employed.

Figure 2C:
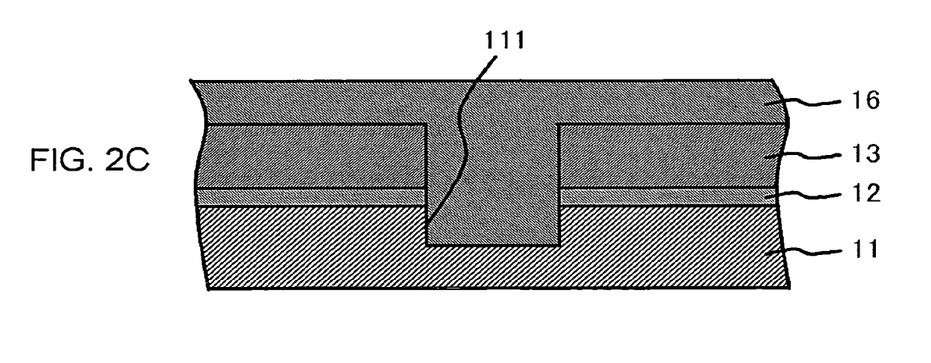
Figure 3A:
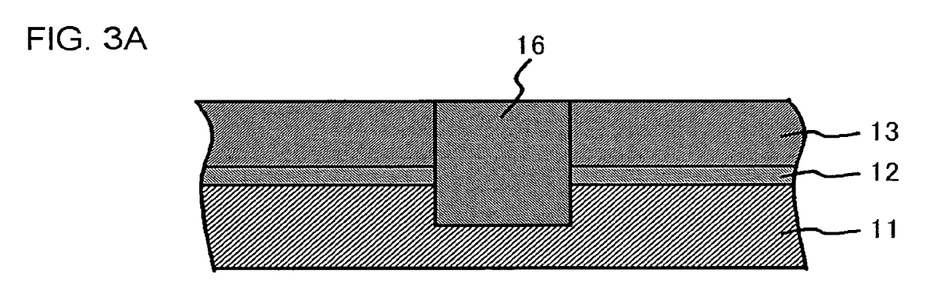
FIGS. 3A and 3B are cross-sectional view of the semiconductor device, illustrating the process for manufacturing the semiconductor device according to an embodiment of the present invention.
Figure 3B:
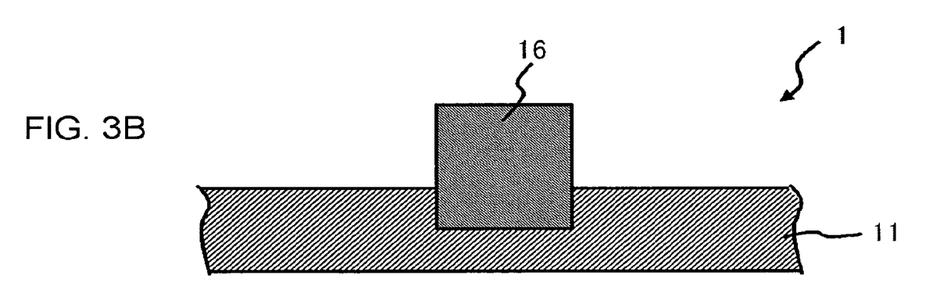

Next, the element isolation film 16 is deposited so as to fill the trenched portion 111 therewith and cover the silicon nitride film 13 (FIG. 2C). Typical element isolation film 16 includes a silicon oxide film, and such type of an element isolation film may be deposited via a CVD process. Then, the element isolation film 16 formed on the silicon nitride film 13 is removed via a chemical mechanical polishing (CVD) process until the silicon nitride film 13 is exposed, as shown in FIG. 3A. By using such procedure, the surface of the element isolation film 16 embedded in the trenched portion 111 and the surface of the silicon nitride film 13 become substantially co-planar. Next, as shown in FIG. 3B, the silicon nitride film 13 and the silicon oxide film 12 are removed via a wet etch process. Thereafter, elements such as transistors and the like are provided in the device-forming region, thereby the manufacture of the semiconductor device 1 is completed.

Advantageous effects obtainable by employing the configuration of the present embodiment will be described as follows. The amorphous carbon film 14 that covers the silicon nitride film 13 is employed as a mask for forming the trenched portion 111 of the silicon substrate 11 via the etch process. Therefore, it is considered that the silicon nitride film 13 is subjected to substantially no influence by the etch process for forming the trenched portion 111, when trenched portion 111 is formed via the etch process. Therefore, in the present embodiment, the silicon nitride film 13 having a desired thickness can be assured after the etch process for forming the trenched portion 111. Then, the amorphous carbon film 14, which has been affected by the etch process for forming the trenched portion 111, is removed, and thereafter, the element isolation film 16 is deposited, and then the element isolation film 16 formed on the silicon nitride film 13 is polished and removed. Therefore, the silicon nitride film 13, which is subjected to substantially no influence by the etch process for forming the trenched portion 111, can be utilized for the stop film for the polishing process. Therefore, in the present embodiment, the element isolation film 16 having a desired height dimension from the surface of the silicon substrate 11 (protruding level) can be formed.

Further, since the silicon nitride film 13 is subjected to substantially no influence by the etch process for forming the trenched portion 111 in the present embodiment, a variation in the thickness of the silicon nitride film 13 is less to be created. Therefore, a variation in the height dimension from the surface of the silicon substrate 11 of the element isolation film 16 can be avoided.

Alternatively, when the element isolation film 16 is deposited without removing the amorphous carbon film 14, the amorphous carbon film 14 serves as a stop film for polishing in the polishing process for the element isolation film 16. It is considered that the amorphous carbon film 14 is also etched during the formation of the trenched portion 111, and thus it is considered that a variation is created in the film thickness of the amorphous carbon film 14. Therefore, when the amorphous carbon film 14 is utilized as the stop film for polishing, a variation is created in the height from the surface of the silicon substrate 11 of the element isolation film 16. Further, if the element isolation film 16 is deposited without removing the amorphous carbon film 14, the amorphous carbon film 14 may be possibly deteriorated by a heat generated in the deposition of the element isolation film 16. On the contrary, since the present embodiment involves depositing the element isolation film 16 after the amorphous carbon film 14 is removed, such issue is not created.

Further, since the present embodiment utilizes the amorphous carbon film 14 as the protective film formed on the silicon nitride film 13, the amorphous carbon film 14 can be easily removed via a dry etch (ashing) process employing oxygen gas.

Therefore, the amorphous carbon film 14 is removed after the trenched portion 111 is formed, and the silicon nitride film 13, which is less influenced by the etch process for forming the trenched portion 111, can be easily exposed. In addition, the present embodiment involves removing the amorphous carbon film 14, under a condition of a selectivity (etch rate for amorphous carbon film 14/etch rate for silicon nitride film 13) of equal to or higher than 20, and more preferably equal to or higher than 100. Thus, the etching of the silicon nitride film 13 is substantially prevented, and thus a desired thickness of the silicon nitride film 13 can be presented. In particular, a removal of the amorphous carbon film 14 via the dry etch (ashing) process employing oxygen gas can surely prevent the silicon nitride film 13 from being etched, and thus a desired thickness of the silicon nitride film 13 can be presented.

Further, the present embodiment involves forming the trenched portion 111 under a condition of a selectivity presented by: (etch rate for silicon substrate 11/etch rate for amorphous carbon film 14) of equal to or higher than 5. The trenched portion 111 is formed under such condition, such that a removal of the amorphous carbon film 14 serving as the protective film and an exposure of the silicon nitride film 13 are avoided during the formation of the trenched portion 111. This can prevent the silicon nitride film 13 from being affected by the etch process for forming the trenched portion 111.

Further, the present embodiment involves depositing the inorganic film 15 on the amorphous carbon film 14, applying the resist on the inorganic film 15 to form the mask 17. When the mask 17 is directly formed on the amorphous carbon film 14, unlikely as the present embodiment, the mask 17 may also be etched together with the amorphous carbon film 14 during the etch process for the amorphous carbon film 14. Further, since the conventional process involves removing the mask 17 after amorphous carbon film 14 is etched, the amorphous carbon film 14 may also possibly be removed during the removal of the mask 17. On the contrary, the present embodiment involves applying the resist on the inorganic film 15 disposed on the amorphous carbon film 14 to form the mask 17. Therefore, when the mask 17 is removed after the etch process, the amorphous carbon film 14 is protected by the inorganic film 15.

It can be understood that the present invention is not limited to the above-described embodiments, and various modifications and variations of the present invention are within a scope of the invention as long as these modifications can provide the object of the present invention. For example, while the cross-sectional geometry of the trenched portion 111 is provided to be substantially rectangular geometry in the above-described embodiment, the cross-sectional geometry is not limited thereto, and the trenched portion 111 may be formed to be a taper-shaped, in which a diameter thereof is decreased from the side of the aperture toward the side of the bottom surface. Further, while the amorphous carbon film 14 is utilized as the protective film for protecting the silicon nitride film 13 in the above-described embodiment, it is not limited thereto. The protective film is not limited to the amorphous carbon film 14, and a carbon film formed via a CVD process may alternatively be employed. Further, the protective film is not limited to a carbon film, and a film, which is capable of being removed under a condition for causing substantially no etching of the silicon nitride film 13 during the process for removing the protective film (i.e., under a condition of a selectivity (etch rate for protective film/etch rate for silicon nitride film 13) of equal to or higher than 20, and further equal to or higher than 100), may be employed. Further, a film which is capable of serving as a mask when the trenched portion 111 is formed may be employed. The protective film is not limited to a film having a monolayer structure, but may be a film having a multiple-layered structure, if the film has the above-described nature.

EXAMPLE

An example of the present invention will be described. A formation of an element isolation film was conducted in a process similar to that described in the above embodiment. Similarly as in the above-described embodiment, a silicon oxide film (thickness: 10 nm) was formed on a silicon substrate, and a silicon nitride film (thickness: 120 nm), an amorphous carbon film (thickness: 120 nm) and an inorganic film (SiOC film, thickness: 30 nm) were deposited on the silicon oxide film.

Next, a mask having a predetermined pattern was formed on the inorganic film, and then the inorganic film was dry etched with $SF_6$ gas at a pressure of 5 mTorr. Further, a gaseous mixture of $O_2$ gas and HBr gas was employed to generate a plasma, and then the amorphous carbon film was dry etched. In this case, the mask on inorganic film was removed by the dry etch process. On the contrary, substantially no inorganic film itself was removed. A selectivity presented by (etch rate for amorphous carbon film/etch rate for inorganic film) was equal to or higher than 20. Next, a dry etch process for the silicon nitride film and the silicon oxide film was conducted. $CHF_3$ gas was employed as an etchant gas, and a pressure was set at 50 mTorr. The inorganic film was removed by such etch process. Further, the amorphous carbon film was partially etched by an amount of about 10 to 40 nm in thickness. A selectivity presented by etch rate for silicon nitride film/etch rate for amorphous carbon film was equal to or higher than 3.

Then, the silicon substrate was dry etched to form a trenched portion. $Cl_2$ gas was employed as an etchant gas.

While the amorphous carbon film was partially etched by an amount of about 20 to 70 nm in thickness in this case, the silicon nitride film was not exposed. A selectivity presented by etch rate for silicon substrate/etch rate for amorphous carbon film was equal to or higher than 5.

Next, a process for removing the amorphous carbon film was conducted. $O_2$ gas was employed as an etchant gas. A plasma was generated, and a dry etch process is conducted with generated oxygen radical to remove the amorphous carbon film. The pressure was set at 4 mTorr. In such occasion, the removal of the amorphous carbon film simultaneously caused an exposure of the silicon nitride film. The exposed silicon nitride film was not etched, and had a thickness that was substantially the same as the thickness thereof at the time of the deposition. An etch rate for the amorphous carbon film, was equal to or higher than 100 nm/min, and a selectivity presented by: (etch rate for amorphous carbon film/etch rate for silicon nitride film) was equal to or higher than 100. Thereafter, similarly as in the above-described embodiment, an element isolation film was deposited, so as to fill the trenched portion of the silicon substrate therewith and cover the silicon nitride film. Further, the element isolation film formed on the silicon nitride film was removed via a chemical mechanical polishing process until the silicon nitride film was exposed. The silicon nitride film and the silicon oxide film were removed via a wet etch process. A height dimension of the element isolation film from the surface of the silicon substrate was substantially equivalent to the thickness of the silicon nitride film.

It is apparent that the present invention is not limited to the above embodiment, and may be modified and changed without departing from the scope and spirit of the invention.

What is claimed is:

1. A method for manufacturing a semiconductor device, comprising:
   providing a predetermined pattern of a silicon nitride film and an amorphous carbon protective film which covers the silicon nitride film on a silicon semiconductor substrate;

selectively etching the semiconductor substrate using said amorphous carbon protective film as a mask to form a trenched portion, the trenched portion being formed via an etch process using an etchant gas under a condition in which an etch selectivity is represented by a ratio:

(an etch rate of said silicon semiconductor substrate)/(an etch rate of said amorphous carbon protective film) is equal to or higher than 5;

removing said amorphous carbon protective film to expose said silicon nitride film;

depositing an element isolation film so as to fill said trenched portion therewith and cover said silicon nitride film;

removing the element isolation film formed on said silicon nitride film by polishing thereof until said silicon nitride film is exposed; and removing said silicon nitride film.

2. The method for manufacturing the semiconductor device according to claim 1, wherein said amorphous carbon protective film is formed via a chemical vapor deposition (CVD) process, and wherein in said removing said protective film, said protective film is removed via an ashing process employing oxygen gas as an ashing gas.

3. The method for manufacturing the semiconductor device according to claim 1, wherein said providing a predetermined pattern of a silicon nitride film and a protective film which covers the silicon nitride film over a semiconductor substrate comprises:

depositing said silicon nitride film and said amorphous carbon protective film which covers the silicon nitride film on said semiconductor substrate;

depositing an inorganic film on said amorphous carbon protective film wherein said inorganic film is a SiOC film, a SiON film or a $SiO_2$ film;

providing a mask having a predetermined pattern by applying a resist on said inorganic film;

selectively removing said inorganic film to form a predetermined pattern;

removing said resist and selectively removing said amorphous carbon protective film using said inorganic film as a mask to form a predetermined pattern of said protective film; and removing said inorganic film, and selectively removing said silicon nitride film using said amorphous carbon protective film as a mask to form a predetermined pattern of said silicon nitride film.

4. The method for manufacturing the semiconductor device according to claim 3, wherein a ratio of oxygen radical dry etch rate for the amorphous carbon protective film/etch rate of the inorganic film is equal to or greater than 10.

5. The method for manufacturing the semiconductor device according to claim 3, wherein a ratio of oxygen radical dry etch rate for the amorphous carbon protective film/etch rate of the inorganic film is equal to or greater than 20.

6. The method for manufacturing the semiconductor device according to claim 3, wherein the inorganic film and the amorphous carbon protective film form an anti-reflection film.

7. The method for manufacturing the semiconductor device according to claim 1, wherein when removing the silicon nitride film, a ratio of dry etch rate for the silicon nitride film/amorphous carbon protective film/etch rate of the inorganic film is equal to or greater than 3.

8. The method for manufacturing the semiconductor device according to claim 1, wherein when removing the amorphous carbon protective film, a ratio of dry etch ashing etch rate for amorphous carbon film/etch rate of silicon nitride film is equal to or greater than 20.

9. The method for manufacturing the semiconductor device according to claim 1, wherein when removing the amorphous carbon protective film, a ratio of dry etch ashing etch rate for amorphous carbon film/etch rate of silicon nitride film is equal to or greater than 100.

10. The method for manufacturing the semiconductor device according to claim 1, wherein the silicon nitride film has a thickness of 50-150 nm.

11. The method for manufacturing the semiconductor device according to claim 1, wherein the amorphous carbon protective film has a thickness of 50-150 nm.

12. The method for manufacturing the semiconductor device according to claim 1, wherein the amorphous carbon protective film is formed directly on the silicon nitride film.

13. The method for manufacturing the semiconductor device according to claim 1, wherein the etchant gas is a mixture of halogen-containing gas and at least one of $O_2$, $N_2$ or He.

14. The method for manufacturing the semiconductor device according to claim 1, wherein the halogen-containing gas is selected from $Br_2$, $Cl_2$ or $SF_6$.

* * * * *